(12) United States Patent
Jung et al.

(10) Patent No.: US 6,399,465 B1
(45) Date of Patent: Jun. 4, 2002

(54) METHOD FOR FORMING A TRIPLE WELL STRUCTURE

(75) Inventors: Le-Tien Jung, Hsinchu; Po-Hung Chen, Taipei, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/513,270

(22) Filed: Feb. 24, 2000

(51) Int. Cl.[7] .................................................. H01L 21/265
(52) U.S. Cl. ...................... 438/519; 438/514; 438/549; 438/527
(58) Field of Search .................................. 438/546, 549, 438/514, 519, 521, 526, 527, 531

(56) References Cited

U.S. PATENT DOCUMENTS

| | | | | |
|---|---|---|---|---|
| 3,635,772 A | * | 1/1972 | Pestie et al. ................. 148/187 |
| 3,703,420 A | * | 11/1972 | Vora ............................ 148/175 |
| 3,717,514 A | * | 2/1973 | Burgess ...................... 148/175 |
| 3,852,127 A | * | 12/1974 | Lamming ................... 148/187 |
| 5,330,922 A | * | 7/1994 | Erdeljac et al. ............... 437/30 |
| 5,565,369 A | * | 10/1996 | Ko ................................ 437/30 |
| 5,851,863 A | * | 12/1998 | Fujii et al. ................... 438/203 |
| 5,866,446 A | * | 2/1999 | Inoh ............................ 438/202 |
| 5,943,595 A | * | 8/1999 | Akiyama et al. ........... 438/527 |
| 5,962,888 A | * | 10/1999 | Kim et al. ................... 257/315 |
| 6,051,371 A | * | 4/2000 | Mita et al. ................... 430/330 |
| 6,077,746 A | * | 6/2000 | You et al. ................... 438/276 |
| 6,083,783 A | * | 7/2000 | Lin et al. ..................... 438/199 |
| 6,194,319 B1 | * | 2/2001 | Carstensen .................. 438/700 |
| 6,211,003 B1 | * | 4/2001 | Taniguchi et al. .......... 438/228 |

FOREIGN PATENT DOCUMENTS

| DE | 4333978 A1 | * | 4/1995 | ....... H01L/21/8247 |
|---|---|---|---|---|
| JP | 55128821 A | * | 10/1980 | ......... H01L/21/205 |
| JP | 56052751 A | * | 5/1981 | ........... H01L/21/30 |

* cited by examiner

*Primary Examiner*—Matthew Smith
*Assistant Examiner*—Renzo N. Rocchegiani
(74) *Attorney, Agent, or Firm*—J. C. Patents

(57) ABSTRACT

A method of forming a triple well structure. A first photoresist layer is formed on a substrate having a first conductive type. A first ion implantation process is performed to form a first well, which has the first conductive type but a dopant concentration of the first well is higher than a dopant concentration of the substrate. The first photoresist layer is baked. A second ion implantation process is performed through the baked first photoresist layer to form a first doped region under the first well. The first doped region has a second conductive type. After removing the first photoresist layer, a second photoresist layer is formed on the substrate. A third ion implantation process is performed to form a second doped region in the substrate around the first well and to form a second well in the substrate. The second doped region and the second well have the second conductive type. The second doped region and the first doped region together surround the first well. The first doped region, the first well, and the second doped region compose a triple well structure.

14 Claims, 2 Drawing Sheets

METHOD FOR FORMING A TRIPLE WELL STRUCTURE

BACKGROUND OF THE INVENTION

1. Field of the Invention

The invention relates in general to the fabrication of semiconductor integrated circuits (ICs), and more particularly to a method form forming a triple well structure.

2. Description of the Related Art

Conventional DRAM process commonly utilizes a twin well structure. The twin well includes a P-well, which is often used for forming a memory region and an N-type MOS, and an N-well, which is used for forming a P-type MOS. However, in an embedded DRAM, a memory region and a logical region are incorporated in the same wafer. Since the memory region and the logical region are supplied with different back bias, in order to prevent bias interference between the logical region and the memory region, a third well must be formed to isolate these two regions from each other. Therefore, it is desired to form the third well, such as a deep well, in the substrate to isolate the logical region and the memory region.

A conventional embedded DRAM memory region having a triple well is formed on a P-type substrate. A transistor is located in the P-type substrate. The transistor comprises an N-type gate and N-type source/drain regions. The N-type gate is formed on the P-type substrate. The N-type source/drain regions are formed within the substrate beside the N-type gate. A bit line contact would be formed on the N-type source region.

A P-type field is located in the P-type substrate under the transistor. A deep N-well is formed in the P-type substrate under the P-type field. An isolation N-well is formed around the P-type field. A bottom portion of the isolation N-well overlaps with a side portion of the deep N-well. The isolation N-well and the deep N-well together surround a portion of the P-type substrate, which is employed as a P-well. The isolation N-well, the P-well, and the deep N-well together form a triple well structure.

A method of forming the conventional triple well structure is described as follow and shown in FIGS. 1A–1C. Referring to FIG. 1A, a photoresist layer 102 is formed over a provided P-type substrate 100. The photoresist layer 102 has an opening exposing a part of the substrate 100. A first ion implantation process $I_1$ is performed to formed a deep N-well 104 in the substrate 100.

Referring to FIG. 1B, the photoresist layer 102 is removed. A photoresist layer 106 is formed on the substrate 100. The photoresist layer 106 has an opening exposing a part of the substrate 100 located above a portion of the deep N-well 104. A second ion implantation process $I_2$ is performed to formed an isolation N-well 108 above the deep N-well 104. The bottom portion of the isolation N-well 108 overlaps with a side of the deep N-well 104.

Referring to FIG. 1C, the photoresist layer 106 is removed. Another photoresist layer 112 is formed on the substrate 100 exposing a portion of the substrate 100 located over the deep N-well 104. A third ion implantation process $I_3$ is performed to form a P-well 114 in the substrate 100. The deep N-well 104 and the isolation N-well 108 surround the P-well 114. A triple well structure is thus formed.

The conventional method described above requires forming three photoresist layers and performing three photolithography processes. For semiconductor fabrication, using more photoresist layers would increase complex level of fabrication. Furthermore, misalignment deviation would be increased.

SUMMARY OF THE INVENTION

The invention provides a method for forming a triple well structure. One photoresist layer is omitted so that the fabrication for forming the triple well structure becomes easier. Misalignment deviation for using different photoresist layers also can be decreased.

The method of the invention is applied on a provided substrate having a first conductive type. A first photoresist layer is formed on the substrate. A first ion implantation process is performed to form a first well, which has the first conductive type but a dopant concentration of the first well is higher than a dopant concentration of the substrate. The first photoresist layer is baked so that the volume of the first photoresist layer is decreased and the opening pattern of the first photoresist layer is thus expanded. A second ion implantation process is performed according to the expanded opening of the baked first photoresist layer to form a first doped region under the first well. The first doped region has a second conductive type. The first photoresist layer is removed. After removing the first photoresist layer, a second photoresist layer is formed on the substrate. A portion of the substrate is exposed. A third ion implantation process is performed to form a second doped region in the substrate around the first well and to form a second well in the substrate. The second doped region and the second well have the second conductive type. The second doped region and the first doped region together surround the first well. The first doped region, the first well, and the second doped region compose a triple well structure.

The invention performs a baking step to expand the opening pattern of the first photoresist layer and performs the second ion implantation process according to the expanded opening pattern. One photoresist layer can be omitted so that the fabrication of the invention is easier than a conventional fabrication of a triple well structure.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
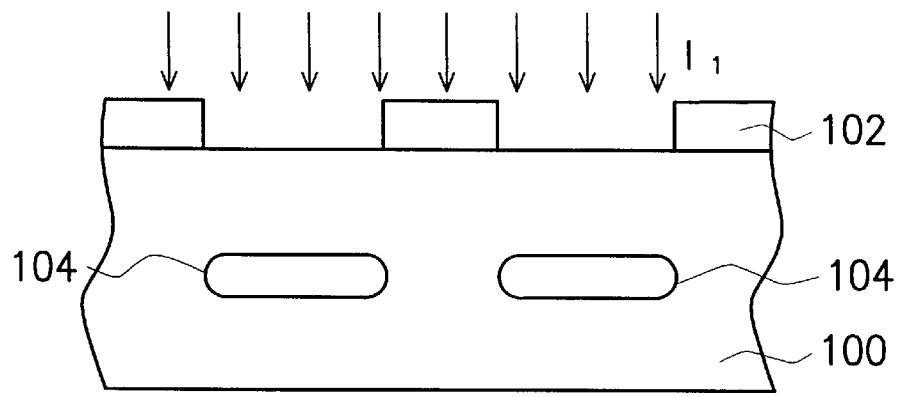
FIGS. 1A to 1C are schematic, cross-sectional views showing a conventional fabricating process for a triple well structure.
Figure 1B:
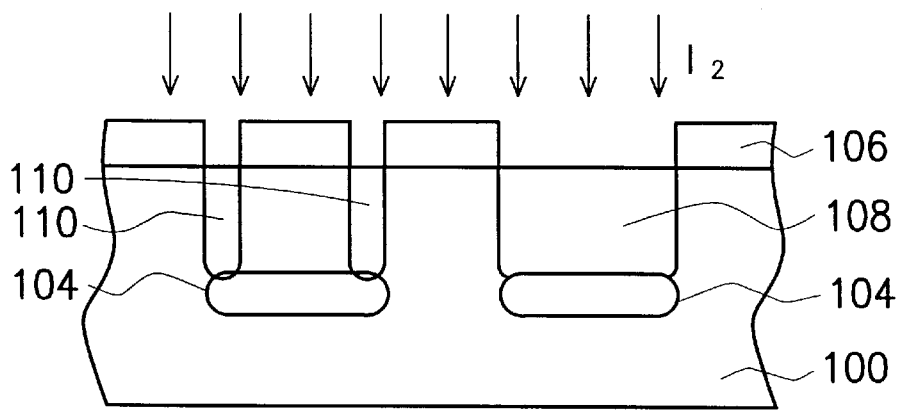
Figure 1C:
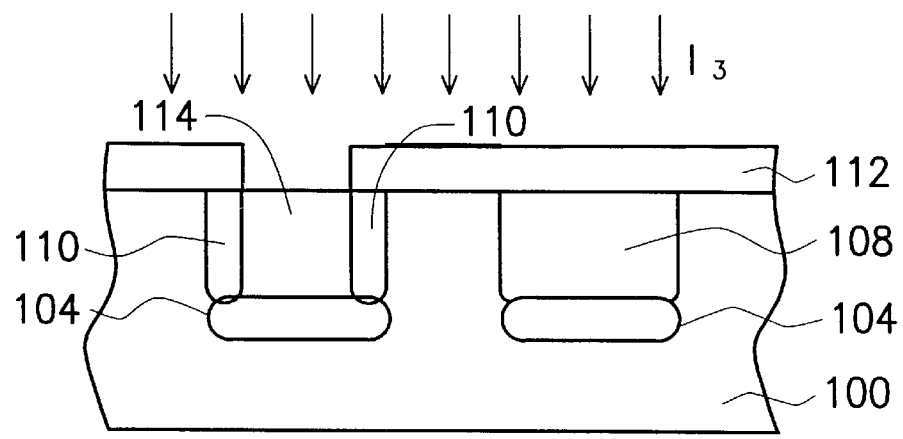

Reference will now be made in detail to the present preferred embodiments of the invention, examples of which are illustrated in the accompanying drawings. Wherever possible, the same reference numbers are used in the drawing and the description to refer to the same or like parts.

Figure 2A:
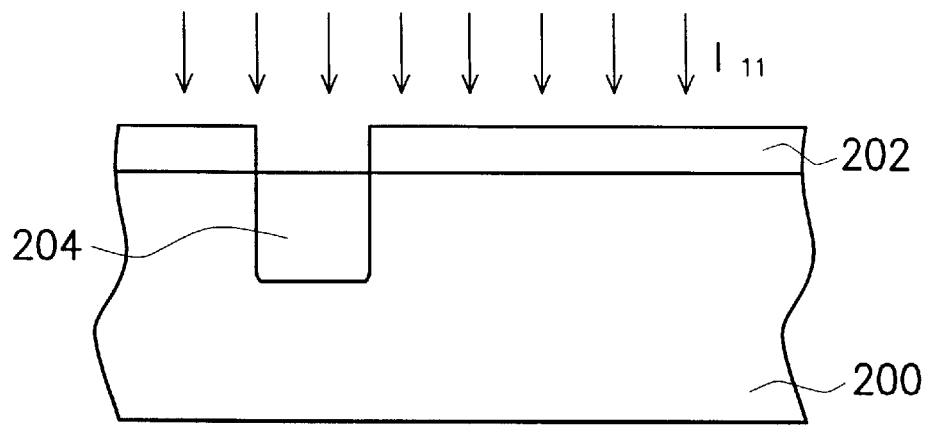
FIGS. 2A to 2C are schematic, cross-sectional views showing the process steps of one preferred embodiment of the method for forming a triple well structure.
Figure 2B:
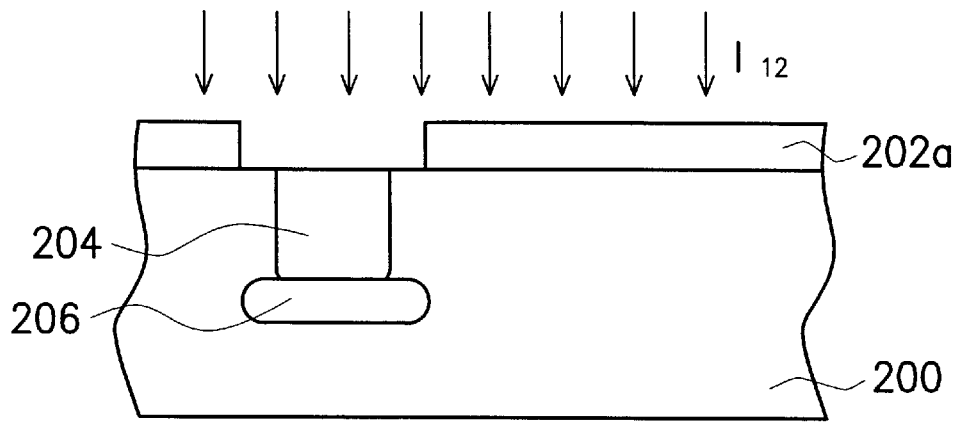
Figure 2C:
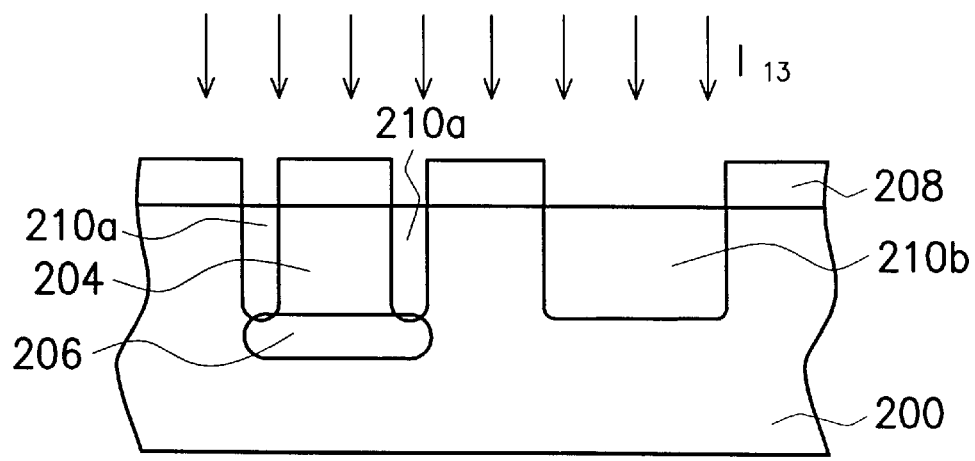

FIGS. 2A to 2C are schematic, cross-sectional views showing the process steps of one preferred embodiment of the method for forming a triple well structure.

Referring to FIG. 2A, a substrate 200 is provided. The substrate 200 has a first conductive type. A first photoresist layer 202 is formed on the substrate 200. The first photoresist layer 202 has a first pattern exposing a portion of the substrate 200. A first ion implantation process $I_{11}$ is performed to form a well 204 in the substrate 200 according to the first pattern of the first photoresist layer 202. The well 204 has the first conductive type, which is as same as the substrate 200. However, a dopant concentration of the well 204 is higher than a dopant concentration of the substrate 200.

Referring to FIG. 2B, the first photoresist layer 202 is baked so that a volume of the first photoresist layer 202a is shrunk and size of the first pattern is expanded to about 1–3 μm. A second ion implantation process $I_{12}$ is performed to form a doped region 206 under the well 204 according to the expanded first pattern. The doped region 206 has a second conductive type.

Referring to FIG. 2C, the shrunk first photoresist layer 202a is removed. A second photoresist layer 208 having a second pattern is formed on the substrate 200. A third ion plantation process $I_{13}$ is performed to form a second doped region 210a and a second well 210b in the substrate 200 according to the second pattern of the second photoresist layer 208. The second doped region 210a and the second well 210b have the second conductive type. The second doped region 210a and the first doped region 206 surround the first well 204. A dopant concentration of the second doped region 210a and a dopant concentration of the first doped region 204 may be the same or different. The first conductive type and the second conductive type are opposed. If the first conductive type is N-type, the second conductive type must be P-type. On the other hand, if the first conductive type is P-type, the second conductive type must be N-type.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming a triple well structure, comprising the steps of:
   providing a substrate;
   forming a first photoresist layer on the substrate, wherein the first photoresist layer has a first pattern exposing a portion of the substrate;
   performing a first ion implantation process to form a first well in the substrate;
   baking the first photoresist layer to expand the first pattern of the first photoresist layer;
   performing a second ion implantation process to form a first doped region in the substrate under the first well;
   removing the photoresist layer;
   forming a second photoresist layer on the substrate, wherein the second photoresist layer has a second pattern;
   performing a third ion implantation process to form a second doped region around the first well and to form a second well in the substrate, wherein a bottom of the second doped region overlaps with a side portion of the first doped region.

2. The method according to claim 1, wherein the substrate and the first well have a first conductive type; and the second well, the first doped region, and the second doped region have a second conductive type.

3. The method according to claim 2, wherein a dopant concentration of the first well is higher than a dopant concentration of the substrate.

4. The method according to claim 2, wherein the second well, the first doped region, and the second doped region have the same dopant concentration.

5. The method according to claim 2, wherein the first conductive type is N-type and the second conductive type is P-type.

6. The method according to claim 2, wherein the first conductive type is P-type and the second conductive type is N-type.

7. The method according to claim 1, wherein a size of the first pattern of the first photoresist layer is expanded of about 1–3 um after baking the first photoresist layer.

8. A method for forming a triple well structure, comprising the steps of:
   forming a first photoresist layer having a first pattern over a substrate;
   forming a first well in the substrate according to the first pattern;
   expanding the first pattern by a baking process;
   forming a first doped region in the substrate under the first well according to the expanded first pattern;
   removing the first photoresist layer;
   forming a second photoresist layer having a second pattern on the substrate; and
   forming a second doped region in the substrate around the first well and forming a second well in the substrate according to the second pattern.

9. The method according to claim 8, wherein the substrate and the first well have a first conductive type; and the second well, the first doped region, and the second doped region have a second conductive type.

10. The method according to claim 9, wherein a dopant concentration of the first well is higher than a dopant concentration of the substrate.

11. The method according to claim 9, wherein the second well, the first doped region, and the second doped region have the same dopant concentration.

12. The method according to claim 9, wherein the first conductive type is N-type and the second conductive type is P-type.

13. The method according to claim 9, wherein the first conductive type is P-type and the second conductive type is N-type.

14. A method for forming a triple well structure, comprising the steps of:
   forming a first photoresist layer having a first pattern over a substrate;
   forming a first well in the substrate according to the first pattern;
   expanding the first pattern to about 1–3 um by baking;
   forming a first doped region in the substrate under the first well according to the expanded first pattern;
   removing the first photoresist layer;
   forming a second photoresist layer having a second pattern on the substrate; and
   forming a second doped region in the substrate around the first well and forming a second well in the substrate according to the second pattern.

* * * * *